(12) United States Patent
Hasegawa et al.

(10) Patent No.: US 9,559,218 B2
(45) Date of Patent: Jan. 31, 2017

(54) SEMICONDUCTOR DEVICE AND METHOD OF MANUFACTURING THE SAME

(71) Applicant: TOYODA GOSEI CO., LTD., Kiyosu-shi (JP)

(72) Inventors: Kazuya Hasegawa, Kiyosu (JP); Tohru Oka, Kiyosu (JP); Nariaki Tanaka, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 0 days.

(21) Appl. No.: 15/046,530

(22) Filed: Feb. 18, 2016

(65) Prior Publication Data

US 2016/0254392 A1    Sep. 1, 2016

(30) Foreign Application Priority Data

Feb. 27, 2015 (JP) ................... 2015-037508

(51) Int. Cl.
*H01L 29/872* (2006.01)
*H01L 29/06* (2006.01)
(Continued)

(52) U.S. Cl.
CPC ....... *H01L 29/872* (2013.01); *H01L 21/28537* (2013.01); *H01L 21/28581* (2013.01); *H01L 21/31116* (2013.01); *H01L 21/31144* (2013.01); *H01L 29/0657* (2013.01); *H01L 29/456* (2013.01); *H01L 29/47* (2013.01); *H01L 29/6606* (2013.01); *H01L 29/66143* (2013.01)

(58) Field of Classification Search
CPC ............. H01L 29/872; H01L 21/28537; H01L 21/28581; H01L 21/31116; H01L 21/31144; H01L 29/0657; H01L 29/456; H01L 29/47; H01L 29/6606; H01L 29/66143
See application file for complete search history.

(56) References Cited

U.S. PATENT DOCUMENTS 5,686,753 A      11/1997 Miyata et al.
2006/0097278 A1*  5/2006 Goto ............... H01S 5/0207
                                              257/103
(Continued)

FOREIGN PATENT DOCUMENTS

JP    H 08-139341 A    5/1996
JP    2004-022989 A    1/2004
JP    2004-023050 A    1/2004

*Primary Examiner* — Karen Kusumakar
(74) *Attorney, Agent, or Firm* — McGinn IP Law Group, PLLC

(57) ABSTRACT

A semiconductor device comprises a semiconductor layer including a mesa structure and a peripheral surface extending around the mesa structure, the mesa structure having a plateau shape with an upper surface and a side surface; a Schottky electrode forming a Schottky junction with the upper surface; an insulating film extending from the peripheral surface, across the side surface, and onto the Schottky electrode, the insulating film having an opening formed on the Schottky electrode; and a wiring electrode electrically connected to the Schottky electrode inside the opening, the wiring electrode extending from inside of the opening, across a portion of the insulating film formed on the side surface, and onto another portion of the insulating film formed on the peripheral surface.

18 Claims, 8 Drawing Sheets

(51) Int. Cl.
    *H01L 29/47*     (2006.01)
    *H01L 29/45*     (2006.01)
    *H01L 21/285*     (2006.01)
    *H01L 29/66*     (2006.01)
    *H01L 21/311*     (2006.01)

(56) References Cited

U.S. PATENT DOCUMENTS

| | | | |
|---|---|---|---|
| 2007/0235768 A1* | 10/2007 | Nakazawa | H01L 29/66212 |
| | | | 257/211 |
| 2010/0052014 A1* | 3/2010 | Matsushita | H01L 29/7787 |
| | | | 257/192 |

* cited by examiner

SEMICONDUCTOR DEVICE AND METHOD OF MANUFACTURING THE SAME

CROSS-REFERENCE TO RELATED APPLICATIONS

This application claims priority based on Japanese Patent Application No. 2015-037508 filed on Feb. 27, 2015, the disclosure of which is incorporated herein by reference in its entirety.

BACKGROUND

Technical Field

This invention relates to a semiconductor device and a method of manufacturing the same.

Related Art

A Schottky barrier diode (SBD) is a type of semiconductor device (semiconductor element) for which it is required to suppress leakage current at the reverse voltage by reducing the electric field crowding occurring at an end portion of a Schottky junction. To increase breakdown voltage, suppressing the leakage current at the reverse voltage by reducing the electric field crowding is important, particularly in semiconductor devices used as power devices.

JP08-139341A discloses a semiconductor device as a Schottky barrier diode including a Schottky electrode having a field plate structure formed on a semiconductor layer having a mesa structure. According to the technique of JP08-139341A, an insulating film formed on the mesa structure is partially removed from the upper surface of the mesa structure to form an opening in the insulating film. Then, the Schottky electrode is formed from the inside of the opening in the insulating film to extend along the periphery of the mesa structure. The semiconductor device of JP08-139341A can reduce the electric field crowding occurring at an end portion of a Schottky junction between the semiconductor layer and the Schottky electrode by using the mesa structure of the semiconductor layer and the field plate structure of the Schottky electrode.

The inventor(s) of the present invention have found that in the semiconductor device of JP08-139341A, as tightness of contact between the Schottky electrode and the insulating film reduces, so does the effect of reducing the electric field crowding from a side surface of the mesa structure. Thus, in the structure of JP08-139341A, the Schottky electrode is required to contact the insulating film tightly as well as to maintain a Schottky barrier height relative to the semiconductor layer. This causes a problem in that a material usable as the Schottky electrode must be selected from a narrow range of choices.

Further, in the semiconductor device of JP08-139341A, the Schottky electrode is formed on the semiconductor layer after the insulating film on the semiconductor layer is removed. In this regard, the inventor(s) of the present invention have also found that, even if tightness of contact between the Schottky electrode and the insulating film is ensured, reduction in the Schottky barrier height of the Schottky electrode is unavoidable depending on a material of the insulating film. This causes a problem in that in the structure of JP08-139341A, a material usable as the insulating film must be selected from a narrow range of choices.

Thus, it is desired a technique for a semiconductor device to sufficiently suppress the leakage current at the reverse voltage while allowing each of a material of a Schottky electrode and that of an insulating film to be selected from a wide range of choices. It is also desired a technique for a semiconductor device to achieve cost reduction, a higher level of fineness, ease of manufacture, resource saving, enhancement of usability, enhancement of durability, and the like.

SUMMARY

The present invention has been made to solve at least some of the aforementioned problems. The present invention may be implemented in the following aspects.

(1) According to an aspect of the present invention, there is provided a semiconductor device. The semiconductor device comprises: a semiconductor layer including a mesa structure and a peripheral surface extending around the mesa structure, the mesa structure having a plateau shape with an upper surface and a side surface; a Schottky electrode forming a Schottky junction with the upper surface; an insulating film extending from the peripheral surface, across the side surface, and onto the Schottky electrode, the insulating film having an opening formed on the Schottky electrode; and a wiring electrode electrically connected to the Schottky electrode inside the opening, the wiring electrode extending from inside of the opening, across a portion of the insulating film formed on the side surface, and onto another portion of the insulating film formed on the peripheral surface. According to this aspect, a field plate structure is formed not by the Schottky electrode but by the wiring electrode. Further, this aspect can employ a manufacturing method of forming the insulating film after forming the Schottky electrode. As a result, the leakage current at the reverse voltage can be sufficiently suppressed while each of a material of the Schottky electrode and that of the insulating film is allowed to be selected from a wide range of choices.

(2) In the semiconductor device of the above aspect, a distance between an end portion of the Schottky electrode and an end portion of the opening may be equal to or larger than a distance between the end portion of the Schottky electrode and an end portion of the upper surface. According to this aspect, an area of junction between the Schottky electrode and the insulating film is increased, thereby allowing increase in tightness of contact between the Schottky electrode and the insulating film.

(3) In the semiconductor device of the above aspect, the insulating film may have an inclined surface extending from an end portion of the opening and outward beyond an end portion of the Schottky electrode while facing the inside of the opening. According to this aspect, the thickness of the insulating film located on the end portion of the Schottky electrode can be restricted. Thus, the electric field crowding at the end portion of the Schottky electrode can be effectively reduced from above the end portion of the Schottky electrode.

(4) In the semiconductor device of the above aspect, the Schottky electrode may include: a first electrode layer formed on the upper surface; and a second electrode layer formed on the first electrode layer. In this case, an end portion of the second electrode layer may located inside an end portion of the first electrode layer, and a distance between the end portion of the first electrode layer and the end portion of the second electrode layer may be equal to or larger than a distance between the end portion of the first electrode layer and an end portion of the upper surface. According to this aspect, a distance between a Schottky contact and the wiring electrode can be ensured using the second electrode layer. This can suppress change in electrical characteristics of the Schottky electrode to be caused by the wiring electrode. Additionally, since the end portion of the second electrode layer is located inside the end portion of the first electrode layer, this can suppress change in a Schottky barrier height to be caused by diffusion of a material of the second electrode layer into the end portion of the first electrode layer.

(5) The semiconductor device of the above aspect may further comprise another electrode extending from the Schottky electrode inside the opening and onto the insulating film, the another electrode electrically connecting the Schottky electrode and the wiring electrode. According to this aspect, a distance between the Schottky contact and the wiring electrode can be ensured using the another electrode. This can suppress change in electrical characteristics of the Schottky electrode to be caused by the wiring electrode. Additionally, since the end portion of the different electrode on the first electrode layer is located inside the end portion of the first electrode layer, this can suppress change in a Schottky barrier height to be caused by diffusion of a material of the different electrode into the end portion of the first electrode layer.

(6) In the semiconductor device of the above aspect, a distance between an end portion of the Schottky electrode and an end portion of the upper surface may be 2 µm or less. According to this aspect, the electric field crowding at the end portion of the Schottky electrode can be reduced effectively.

(7) In the semiconductor device of the above aspect, the semiconductor layer may be an n-type semiconductor layer. According to this aspect, the leakage current at the reverse voltage can be suppressed sufficiently in the Schottky electrode formed on the n-type semiconductor layer.

(8) In the semiconductor device of the above aspect, the semiconductor layer may be mainly made of at least one of gallium nitride (GaN), silicon carbide (SiC), silicon (Si), and gallium arsenide (GaAs).

(9) In the semiconductor device of the above aspect, the Schottky electrode may be mainly made of at least one of nickel (Ni), palladium (Pd), platinum (Pt), and iridium (Ir). According to this aspect, a Schottky barrier height formed between the semiconductor layer and the Schottky electrode can be ensured sufficiently.

(10) In the semiconductor device of the above aspect, the wiring electrode may be mainly made of at least one of aluminum (Al), titanium (Ti), molybdenum (Mo), vanadium (V), tantalum (Ta), gold (Au), and copper (Cu). According to this aspect, tightness of contact of the wiring electrode with the insulating film can be ensured sufficiently while electrical resistance is suppressed.

(11) In the semiconductor device of the above aspect, the insulating film may be mainly made of at least one of silicon dioxide ($SiO_2$), aluminum oxide ($Al_2O_3$), silicon nitride (SiNx), silicon oxynitride (SiON), zirconium oxynitride (ZrON), aluminum oxynitride (AlON), zirconium oxide ($ZrO_2$), and hafnium oxide (HfO). According to this aspect, the leakage current at the reverse voltage can be suppressed sufficiently.

(12) In the semiconductor device of the above aspect, an angle of the side surface relative to the peripheral surface may be from 10 to 90 degrees. According to this aspect, the leakage current at the reverse voltage can be suppressed effectively.

(13) In the semiconductor device of the above aspect, the mesa structure may have a height of 0.1 µm or more. According to this aspect, the leakage current at the reverse voltage can be suppressed effectively.

(14) According to another aspect of the present invention, there is provided a method of manufacturing a semiconductor device. The method comprises: forming a mesa structure and a peripheral surface extending around the mesa structure in a semiconductor layer, the mesa structure having a plateau shape with an upper surface and a side surface, while forming a Schottky electrode forming a Schottky junction with the upper surface; forming an insulating film extending from the peripheral surface, across the side surface, and onto the Schottky electrode; forming an opening in the insulating film through which the Schottky electrode is exposed; and forming a wiring electrode electrically connected to the Schottky electrode inside the opening, the wiring electrode extending from inside of the opening, across a portion of the insulating film formed on the side surface, and onto another portion of the insulating film formed on the peripheral surface. According to this aspect, a field plate structure is formed not by the Schottky electrode but by the wiring electrode. Further, since the insulating film can be formed after formation of the Schottky electrode, the leakage current at the reverse voltage can be suppressed sufficiently while each of a material of the Schottky electrode and that of the insulating film is allowed to be selected from a wide range of choices.

(15) In the method of the above aspect, the Schottky electrode may be formed after the mesa structure and the peripheral surface are formed in the semiconductor layer. According to this aspect, damage on the Schottky electrode to be caused by processing on the semiconductor layer can be avoided.

(16) In the method of the above aspect, the mesa structure and the peripheral surface may be formed by dry etching using a mask after the Schottky electrode is formed on the semiconductor layer. According to this aspect, since the Schottky electrode is formed before the mesa structure and the peripheral surface are formed in the semiconductor layer, this can suppress contamination of an interface between the Schottky electrode and the semiconductor layer occurring during processes.

(17) In the method of the above aspect, the Schottky electrode, the mesa structure, and the peripheral surface may be formed by: forming an electrode layer, which is to be shaped into the Schottky electrode, on a surface of the semiconductor layer before the mesa structure and the peripheral surface are formed; and then processing the electrode layer and the semiconductor layer together by dry etching using a mask, thereby forming the Schottky electrode together with the mesa structure and the peripheral surface. According to this aspect, since the electrode layer to be shaped into the Schottky electrode is formed before the mesa structure and the peripheral surface are formed in the semiconductor layer, this can suppress contamination of the interface between the Schottky electrode and the semiconductor layer occurring during processes. Additionally, the distance between the end portion of the Schottky electrode and the end portion of the upper surface can be restricted, so that the electric field crowding at the end portion of the Schottky electrode can be reduced effectively.

(18) In the method of the above aspect, the Schottky electrode, the mesa structure, and the peripheral surface may be formed by: forming the Schottky electrode on a surface of the semiconductor layer before the mesa structure and the peripheral surface are formed; and then processing the semiconductor layer by dry etching using the Schottky electrode as a mask, thereby forming the mesa structure and the peripheral surface. According to this aspect, since the Schottky electrode is formed before the mesa structure and the peripheral surface are formed in the semiconductor layer, this can suppress contamination of the interface between the Schottky electrode and the semiconductor layer occurring during processes. Further, since self-alignment is achieved using the Schottky electrode, this eliminates the need to separately prepare a mask for formation the mesa structure, and reduces manufacturing costs. Additionally, the distance between the end portion of the Schottky electrode and the end portion of the upper surface can be restricted, so that the electric field crowding at the end portion of the Schottky electrode can be reduced effectively.

The present invention may be implemented in various aspects in addition to a semiconductor device and a method of manufacturing the same. For example, the present invention may be implemented in aspects including electrical equipment to which the semiconductor device of the aforementioned aspects is incorporated, and a manufacturing device that manufactures this semiconductor device.

Advantageous Effects

According to the present invention, a field plate structure is formed not by the Schottky electrode but by the wiring electrode. Further, the present invention may employ the manufacturing method of forming the insulating film after forming the Schottky electrode. As a result of these, the leakage current at the reverse voltage will be suppressed sufficiently while each of a material of the Schottky electrode and that of the insulating film is allowed to be selected from a wide range of choices.

DESCRIPTION OF EMBODIMENTS

A. First Embodiment

A-1. Structure of Semiconductor Device

Figure 1:
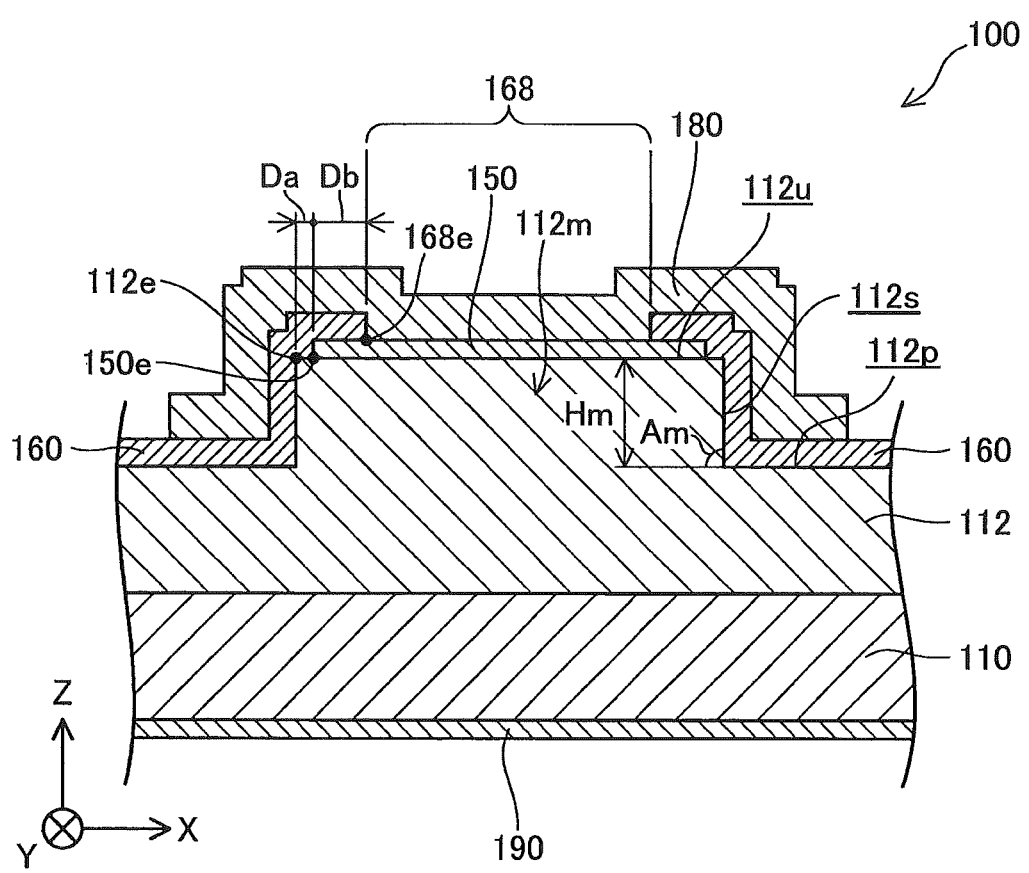
FIG. 1 is a sectional view schematically showing the structure of a semiconductor device according to a first embodiment.

FIG. 1 is a sectional view schematically showing the structure of a semiconductor device 100 according to a first embodiment. FIG. 1 shows an X axis, a Y axis, and a Z axis perpendicular to each other. Of the X, Y, and Z axes shown in FIG. 1, the X axis extends from the left toward the right on the plane of paper of FIG. 1. A+X axis direction extends toward the right of the plane of paper. A−X axis direction extends toward the left of the plane of paper. Of the X, Y, and Z axes shown in FIG. 1, the Y axis extends from the front toward the back of the plane of paper of FIG. 1. A+Y axis direction extends toward the back of the plane of paper. A−Y axis direction extends toward the front of the plane of paper. Of the X, Y, and Z axes shown in FIG. 1, the Z axis extends from the bottom toward the top of the plane of paper of FIG. 1. A+Z axis direction extends toward the top of the plane of paper. A−Z axis direction extends toward the bottom of the plane of paper. The X, Y, and Z axes of FIG. 1 correspond to an X axis, a Y axis, and a Z axis in each of the other drawings.

In this embodiment, the semiconductor device 100 is a GaN-based semiconductor device formed of gallium nitride (GaN). In this embodiment, the semiconductor device 100 is a vertical Schottky barrier diode. In this embodiment, the semiconductor device 100 is used for power control and is also called a power device. The semiconductor device 100 includes a substrate 110, a semiconductor layer 112, a Schottky electrode 150, an insulating film 160, a wiring electrode 180, and a cathode electrode 190.

The substrate 110 of the semiconductor device 100 is a semiconductor with a plate shape extending along the X and Y axes. In this embodiment, the substrate 110 is mainly made of gallium nitride (GaN). In the description of this specification, "being mainly made of gallium nitride (GaN)" means that gallium nitride (GaN) is contained 90% or more in terms of a mole fraction. In this embodiment, the substrate 110 is an n-type semiconductor containing silicon (Si) as a donor element. In this embodiment, an average concentration of silicon (Si) in the substrate 110 is about $1 \times 10^{18}$ cm$^{-3}$.

The semiconductor layer 112 of the semiconductor device 100 is an n-type semiconductor layer disposed on the +Z direction side of the substrate 110 and extending along the X and Y axes. In this embodiment, the semiconductor layer 112 is mainly made of gallium nitride (GaN). In this embodiment, the semiconductor layer 112 contains silicon (Si) as a donor element. In this embodiment, an average concentration of silicon (Si) in the semiconductor layer 112 is about $1 \times 10^{16}$ cm$^{-3}$. In this embodiment, the semiconductor layer 112 is formed by metal organic chemical vapor deposition (MOCVD).

The semiconductor layer 112 includes a mesa structure 112m and a peripheral surface 112p. The mesa structure 112m of the semiconductor layer 112 has a plateau shape with an upper surface 112u and a side surface 112s. In this embodiment, the mesa structure 112m projects in the +Z axis direction further than the peripheral surface 112p. The peripheral surface 112p of the semiconductor layer 112 is a surface that extends around the mesa structure 112m. In this embodiment, the mesa structure 112m and the peripheral surface 112p are formed by dry etching. In this embodiment, the semiconductor layer 112 has a thickness (length in the Z axis direction) of about 10 μm (micrometers) at the mesa structure 112m.

In terms of reducing the electric field crowding at an end portion 150e of the Schottky electrode 150, it is preferable that a height Hm of the mesa structure 112m be greater than the thickness of the insulating film 160. In terms of ensuring processability, it is preferable that the height Hm of the mesa structure 112m be 5 μm or less. In terms of reducing the electric field crowding at the end portion 150e of the Schottky electrode 150, it is preferable that an angle Am of the side surface 112s relative to the peripheral surface 112p be from 10 to 90 degrees.

The Schottky electrode 150 of the semiconductor device 100 is an anode electrode made of a conductive material and forming a Schottky junction with the upper surface 112u of the semiconductor layer 112. In terms of reducing the electric field crowding at the end portion 150e of the Schottky electrode 150, it is preferable that a distance Da between the end portion 150e of the Schottky electrode 150 and an end portion 112e of the upper surface 112u be 2 μm or less.

In this embodiment, the Schottky electrode 150 is formed by stacking the following layers in the order as seen from the semiconductor layer 112 by electron beam deposition: a layer mainly made of nickel (Ni) having a thickness of about 100 nm (nanometers); a layer mainly made of palladium (Pd) having a thickness of about 100 nm; and a layer mainly made of molybdenum (Mo) having a thickness of about 20 nm. Nickel (Ni) in the Schottky electrode 150 forms a Schottky junction with gallium nitride (GaN) in the semiconductor layer 112. Palladium (Pd) in the Schottky electrode 150 increases a Schottky barrier height. Molybdenum (Mo) in the Schottky electrode 150 functions as a barrier metal to prevent mutual diffusion of electrode materials between the Schottky electrode 150 and the wiring electrode 180.

The insulating film 160 of the semiconductor device 100 has electrical insulating properties. The insulating film 160 extends from the peripheral surface 112p and across the side surface 112s, and reaches onto the Schottky electrode 150. In this embodiment, the insulating film 160 is formed by stacking a layer mainly made of silicon dioxide ($SiO_2$) having a thickness of 500 nm by using plasma chemical vapor deposition on a layer mainly made of aluminum oxide ($Al_2O_3$) having a thickness of 100 nm formed by using atomic layer deposition (ALD).

The insulating film 160 includes an opening 168 formed on the Schottky electrode 150. The opening 168 is formed by removing a part of the insulating film 160 by wet etching until the Schottky electrode 150 is exposed. A distance Db between the end portion 150e of the Schottky electrode 150 and an end portion 168e of the opening 168 is equal to or larger than the distance Da between the end portion 150e of the Schottky electrode 150 and the end portion 112e of the upper surface 112u. In terms of ensuring tightness of contact between the Schottky electrode 150 and the insulating film 160, the distance Db is preferably equal to or larger than the distance Da, more preferably five times the distance Da or more, still more preferably 10 times the distance Da or more. To suppress increase in ON resistance caused by reduction in contact area between the Schottky electrode 150 and the wiring electrode 180, it is preferable that the distance Db be 100 times the distance Da or less.

The wiring electrode 180 of the semiconductor device 100 is an anode electrode made of a conductive material and is electrically connected to the Schottky electrode 150 inside the opening 168. In this embodiment, the wiring electrode 180 is formed on the Schottky electrode 150 inside the opening 168. The wiring electrode 180 extends from inside of the opening 168 and across a portion of the insulating film 160 formed on the side surface 112s, and reaches onto a portion of the insulating film 160 formed on the peripheral surface 112p. In this way, the wiring electrode 180 forms a field plate structure that interposes the insulating film 160 between the wiring electrode 180 and the semiconductor layer 112.

In this embodiment, the wiring electrode 180 is formed by stacking the following layers in the order as seen from the Schottky electrode 150 or the insulating film 160 by sputtering: a layer mainly made of titanium (Ti) having a thickness of about 20 nm; a layer mainly made of titanium nitride (TiN) having a thickness of about 200 nm; a layer mainly made of titanium (Ti) having a thickness of about 20 nm; and a layer mainly made of an aluminum-silicon alloy (AlSi) having a thickness of about 2000 nm. Titanium (Ti) in the wiring electrode 180 increases tightness of contact with an adjacent electrode layer and with the insulating film 160. Titanium nitride (TiN) in the wiring electrode 180 functions as a barrier metal to prevent mutual diffusion of electrode materials between electrode layers. The aluminum-silicon alloy (AlSi) in the wiring electrode 180 reduces electrical resistance in the wiring electrode 180.

The cathode electrode 190 of the semiconductor device 100 is an ohmic electrode made of a conductive material and forming an ohmic junction with the substrate 110 at the –Z direction side. In this embodiment, the cathode electrode 190 is formed by stacking a layer made of an aluminum-silicon alloy (AlSi) on a layer mainly made of titanium (Ti) by sputtering.

A-2. Method of Manufacturing Semiconductor Device

Figure 2:
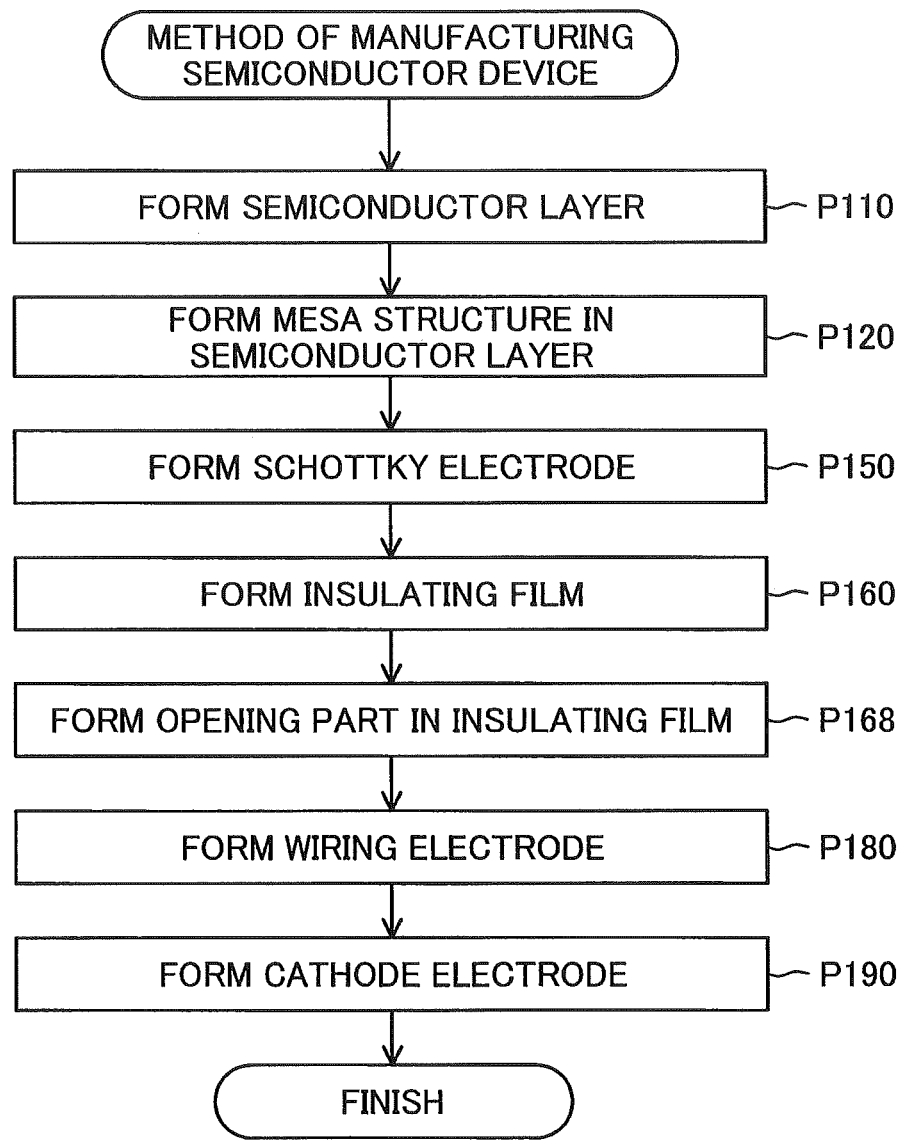
FIG. 2 is a process chart showing a method of manufacturing the semiconductor device according to the first embodiment.

FIG. 2 is a process chart showing a method of manufacturing the semiconductor device 100 according to the first embodiment. A manufacturer of the semiconductor device 100 forms the semiconductor layer 112 on the substrate 110 by epitaxial growth (process P110). In this embodiment, the manufacturer forms the semiconductor layer 112 by epitaxial growth using an MOCVD device that implements metal organic chemical vapor deposition (MOCVD).

After forming the semiconductor layer 112 (process P110), the manufacturer forms the mesa structure 112m in the semiconductor layer 112 and forms the Schottky electrode 150. In this embodiment, the manufacturer forms the mesa structure 112m and the peripheral surface 112p in the semiconductor layer 112 (process P120), and thereafter forms the Schottky electrode 150 (process P150).

In this embodiment, when forming the mesa structure 112m in the semiconductor layer 112 (process P120), the manufacturer forms a mask pattern on a part of a surface of the semiconductor layer 112 to remain as the mesa structure 112m. Then, the manufacturer removes the semiconductor layer 112 partially by dry etching using a chlorine (Cl)-based material, thereby forming the mesa structure 112m and the peripheral surface 112p in the semiconductor layer 112. Next, the manufacturer removes the mask pattern formed on the semiconductor layer 112. In this embodiment, the mask pattern may be a mask mainly made of silicon dioxide ($SiO_2$) or a photoresist.

In this embodiment, for formation of the Schottky electrode 150 (process P150), the manufacturer forms the Schottky electrode 150 by electron beam deposition using a lift-off technique. Electron beam deposition is not the only method of forming the Schottky electrode 150. The Schottky electrode 150 may also be formed by resistance heating deposition or sputtering. According to a different embodiment, the manufacturer may form the Schottky electrode 150 by forming an electrode on the entire surface of the semiconductor layer 112 and then removing this electrode partially. In this embodiment, the manufacturer forms the Schottky electrode 150 by stacking a layer mainly made of nickel (Ni), a layer mainly made of palladium (Pd), and a layer mainly made of molybdenum (Mo) in this order as seen from the semiconductor layer 112.

After forming the Schottky electrode 150 (process P150), the manufacturer forms the insulating film 160 that extends from the peripheral surface 112p and across the side surface 112s, and reaches onto the Schottky electrode 150 (process P160). In this embodiment, the manufacturer forms the insulating film 160 by forming a layer mainly made of aluminum oxide ($Al_2O_3$) using atomic layer deposition (ALD) and then by stacking a layer mainly made of silicon dioxide ($SiO_2$) using plasma chemical vapor deposition (plasma CVD).

After forming the insulating film 160 (process P 160), the manufacturer forms the opening 168 in the insulating film 160 through which the Schottky electrode 150 is exposed (process P168). In this embodiment, the manufacturer forms a mask pattern on a part of a surface of the insulating film 160 except a part to be removed to become the opening 168. Then, the manufacturer removes the insulating film 160 partially by wet etching using a hydrofluoric acid-based material, thereby forming the opening 168 in the insulating film 160. Next, the manufacturer removes the mask pattern formed on the insulating film 160.

After forming the opening 168 in the insulating film 160 (process P168), the manufacturer forms the wiring electrode 180 (process P180). In this embodiment, the manufacturer forms an electrode, which is to be shaped into the wiring electrode 180, by sputtering on the entire surface of the Schottky electrode 150 and the entire surface of the insulating film 160. Then, the manufacturer forms a mask pattern (photoresist) on a part to remain as the wiring electrode 180. Then, the manufacturer removes the source electrode partially by dry etching using a chlorine (Cl)-based material, thereby forming the wiring electrode 180. Next, the manufacturer removes the mask pattern formed on the wiring electrode 180.

After forming the wiring electrode 180 (process P180), the manufacturer forms the cathode electrode 190 (process P190). In this embodiment, the manufacturer forms the cathode electrode 190 by stacking a layer mainly made of an aluminum-silicon alloy (AlSi) on a layer mainly made of titanium (Ti) by sputtering.

As a result of the aforementioned processes, the semiconductor device 100 is completed. According to a different embodiment, at a stage after formation of the semiconductor layer 112 (process P110), the manufacturer may perform the process of forming the cathode electrode 190 (process P190) before the process of forming the wiring electrode 180 (process P180).

A-3. Evaluation Test

Figure 3:
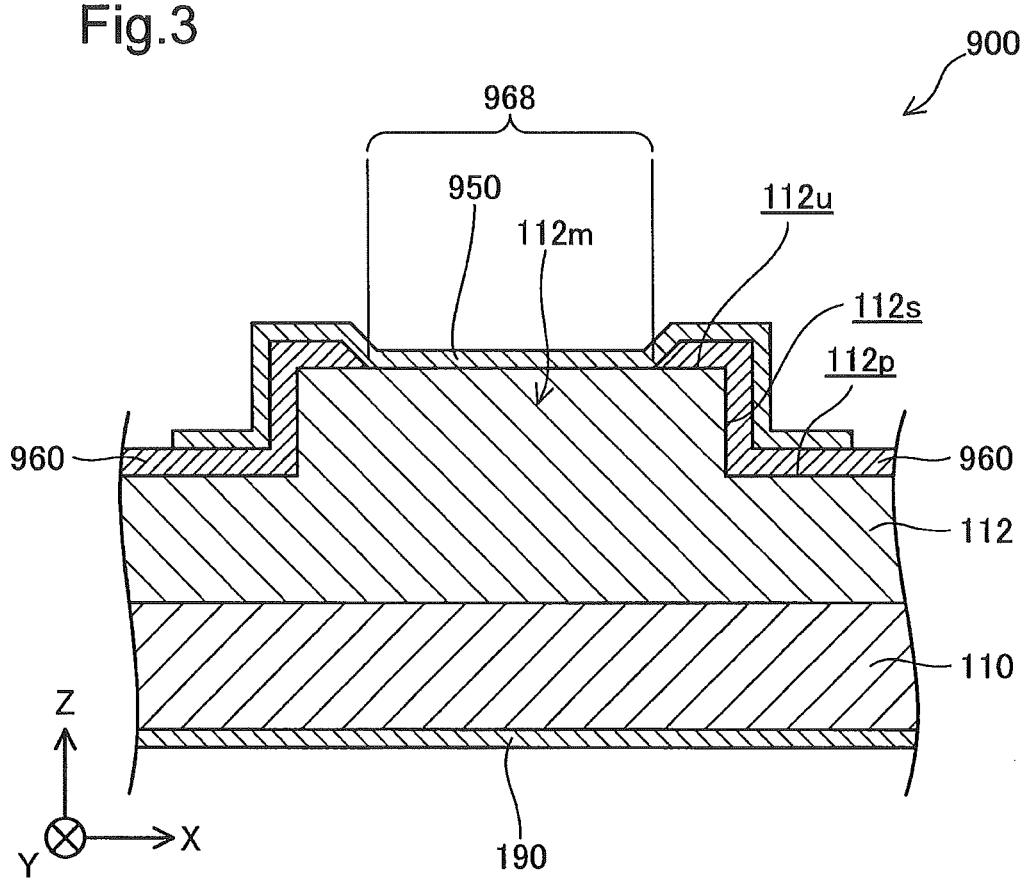
FIG. 3 is a sectional view schematically showing the structure of a semiconductor device prepared as a sample for an evaluation test.

FIG. 3 is a sectional view schematically showing the structure of a semiconductor device 900 prepared as a sample for an evaluation test. A tester prepared the semiconductor device 100 of FIG. 1 as sample A1 and the semiconductor device 900 of FIG. 3 as sample A2. Then, the tester evaluated the Schottky barrier height and the leakage breakdown voltage of each sample.

Like the semiconductor device 100, the semiconductor device 900 includes the substrate 110, the semiconductor layer 112, and the cathode electrode 190. The semiconductor device 900 further includes a Schottky electrode 950 and an insulating film 960. The insulating film 960 of the semiconductor device 900 extends from the upper surface 112$u$ of the mesa structure 112$m$ and across the side surface 112$s$ of the mesa structure 112$m$, and reaches onto the peripheral surface 112$p$. The insulating film 960 is the same as the insulating film 160 of the semiconductor device 100 except that the insulating film 960 has an opening 968 formed on the upper surface 112$u$. The Schottky electrode 950 of the semiconductor device 900 is the same as the Schottky electrode 150 of the semiconductor device 100 except that the Schottky electrode 950 forms a field plate structure that extends from the upper surface 112$u$ inside the opening 968 down to the insulating film 960. In the semiconductor device 900, the opening 968 is formed by partially removing the insulating film 960 formed on the entire surface of the semiconductor layer 112 from the upper surface 112$u$. The Schottky electrode 950 is formed on the upper surface 112$u$ after the insulating film 960 is partially removed.

Figure 4:
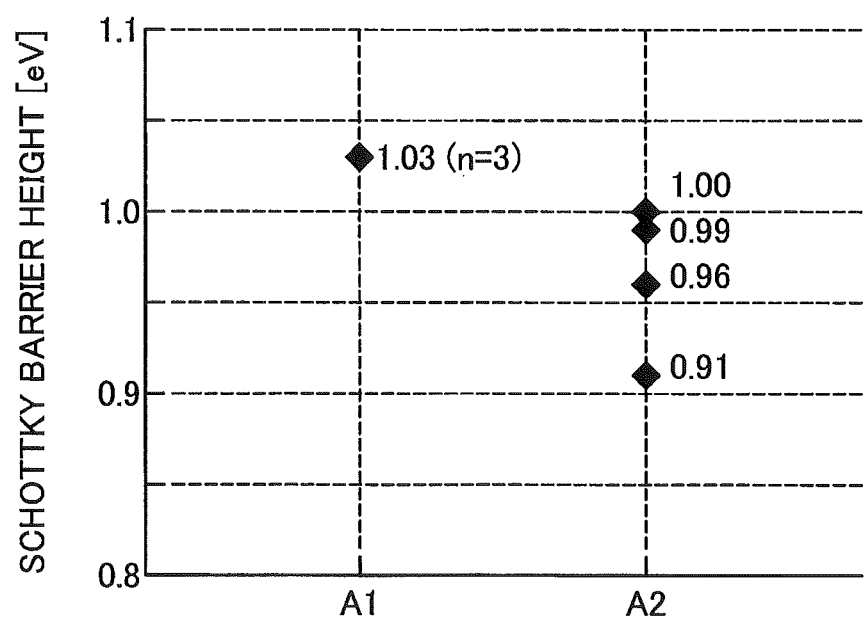
FIG. 4 is a graph showing a result of evaluation of a Schottky barrier height.

FIG. 4 is a graph showing a result of evaluation of a Schottky barrier height. For the evaluation test of FIG. 4, the tester evaluated the Schottky barrier height of each of three samples A1 and each of four samples A2. The evaluation results of FIG. 4 show that the Schottky barrier height of the sample A1 is higher than that of the sample A2. In other words, the sample A1 is superior to the sample A2 in terms of Schottky barrier height. This results from the following factor. Unlike in the sample A2 (semiconductor device 900), in the sample A1 (semiconductor device 100), the Schottky electrode 150 is formed on the upper surface 112$u$ which has not been subject to formation of the insulating film 160 and removal of the insulating film 160 therebefore. Thus, a Schottky contact is formed on the upper surface 112$u$ with less damages.

Figure 5:
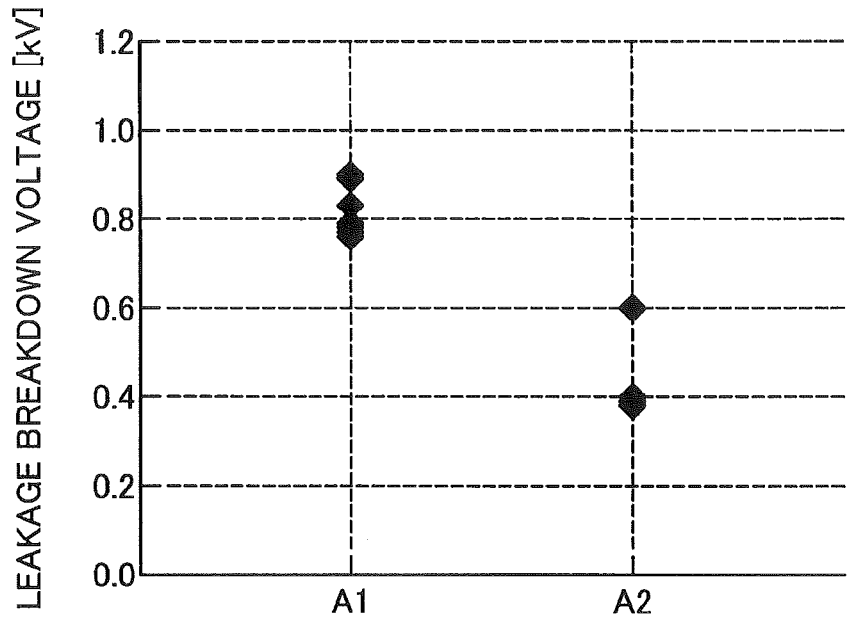
FIG. 5 is a graph showing a result of evaluation of a leakage breakdown voltage.

FIG. 5 is a graph showing a result of evaluation of leakage breakdown voltage. For the evaluation test of FIG. 5, the tester evaluated the leakage breakdown voltage of each of nine samples A1 and each of six samples A2. The leakage breakdown voltage of FIG. 5 shows a voltage at which reverse-direction current density becomes 1 $mA/cm^2$ in each sample. The evaluation results of FIG. 5 show that the sample A1 has a leakage breakdown voltage higher than that of the sample A2. In other words, the sample A1 is superior to the sample A2 in terms of leakage breakdown voltage. This results from the following factor. In addition to the superiority of the sample A1 over the sample A2 in terms of Schottky barrier height, the sample A2 does not provide sufficient tightness of contact between the Schottky electrode 950 and the insulating film 960. This makes it impossible in the sample A2 to reduce the electric field crowding sufficiently using a field plate structure.

A-4. Modifications

In the aforementioned embodiment, a material of the substrate 110 is not limited to gallium nitride (GaN) and may also be any of silicon (Si), sapphire ($Al_2O_3$), and silicon carbide (SiC), for example.

In the aforementioned embodiment, a material of the semiconductor layer 112 is not limited to gallium nitride (GaN) and may also be any of silicon (Si), germanium (Ge), a group III-V compound (such as gallium arsenide (GaAs) or indium phosphide (InP), for example), silicon carbide (SiC), gallium oxide ($Ga_2O_3$), and a wide bandgap semiconductor (such as diamond), for example. The semiconductor layer 112 may be formed of one semiconductor layer or a plurality of semiconductor layers.

In the aforementioned embodiment, a material of the Schottky electrode 150 may be at least any of nickel (Ni), palladium (Pd), platinum (Pt), and iridium (Ir). This can sufficiently ensure a Schottky barrier height formed between the semiconductor layer 112 and the Schottky electrode 150. The Schottky electrode 150 may be formed of one electrode layer or a plurality of electrode layers.

In the aforementioned embodiment, a material of the wiring electrode 180 may be at least one of aluminum (Al), titanium (Ti), molybdenum (Mo), vanadium (V), tantalum (Ta), gold (Au), and copper (Cu). This can ensure sufficient tightness of contact of the wiring electrode 180 with the insulating film 160 while suppressing electrical resistance in the wiring electrode 180. The wiring electrode 180 may be formed of one electrode layer or a plurality of electrode layers. For example, the wiring electrode 180 may be formed of one electrode layer mainly made of aluminum (Al) or one electrode layer mainly made of an aluminum-silicon alloy (AlSi). The wiring electrode 180 may alternatively be formed by stacking the following layers in the order as seen from the Schottky electrode 150 or the insulating film 160: a layer mainly made of titanium (Ti); a layer mainly made of titanium nitride (TiN); a layer mainly made of titanium (Ti); and a layer mainly made of aluminum (Al). The wiring electrode 180 may alternatively be formed by stacking the following layers in the order as seen from the Schottky electrode 150 or the insulating film 160: a layer mainly made of tantalum (Ta); and a layer mainly made of copper (Cu). The wiring electrode 180 may alternatively be formed by stacking the following layers in the order as seen from the Schottky electrode 150 or the insulating film 160: a layer mainly made of tantalum nitride (TaN); and a layer mainly made of copper (Cu).

In the aforementioned embodiment, a material of the insulating film 160 may be at least one of silicon dioxide ($SiO_2$), aluminum oxide ($Al_2O_3$), silicon nitride (SiNx), silicon oxynitride (SiON), zirconium oxynitride (ZrON), aluminum oxynitride (AlON), zirconium oxide ($ZrO_2$), and hafnium oxide (HfO). This can suppress the leakage current at the reverse voltage sufficiently. The insulating film 160 may be formed of one insulating layer or a plurality of insulating layers. For example, the insulating film 160 may be formed of one insulating layer mainly made of silicon nitride (SiNx).

A-5. Advantageous Effect

According to the aforementioned first embodiment, the field plate structure is formed not by the Schottky electrode 150 but by the wiring electrode 180. Further, the first embodiment can employ the manufacturing method of forming the insulating film 160 after forming the Schottky electrode 150. As a result of this, the leakage current at the reverse voltage can be suppressed sufficiently while each of a material of the Schottky electrode 150 and that of the insulating film 160 is allowed to be selected from a wide range of choices.

It should be noted that the distance Db between the end portion 150*e* of the Schottky electrode 150 and the end portion 168*e* of the opening 168 is equal to or larger than the distance Da between the end portion 150*e* of the Schottky electrode 150 and the end portion 112*e* of the upper surface 112*u*. This increases an area of junction between the Schottky electrode 150 and the insulating film 160, thereby allowing increase in tightness of contact between the Schottky electrode 150 and the insulating film 160.

Furthermore, the Schottky electrode 150 is formed (process P150) after the mesa structure 112*m* and the peripheral surface 112*p* are formed in the semiconductor layer 112 (process P120). This can avoid damage on the Schottky electrode 150 to be caused by the dry etching (process P120) of processing the semiconductor layer 112.

B. Second Embodiment

Figure 6:
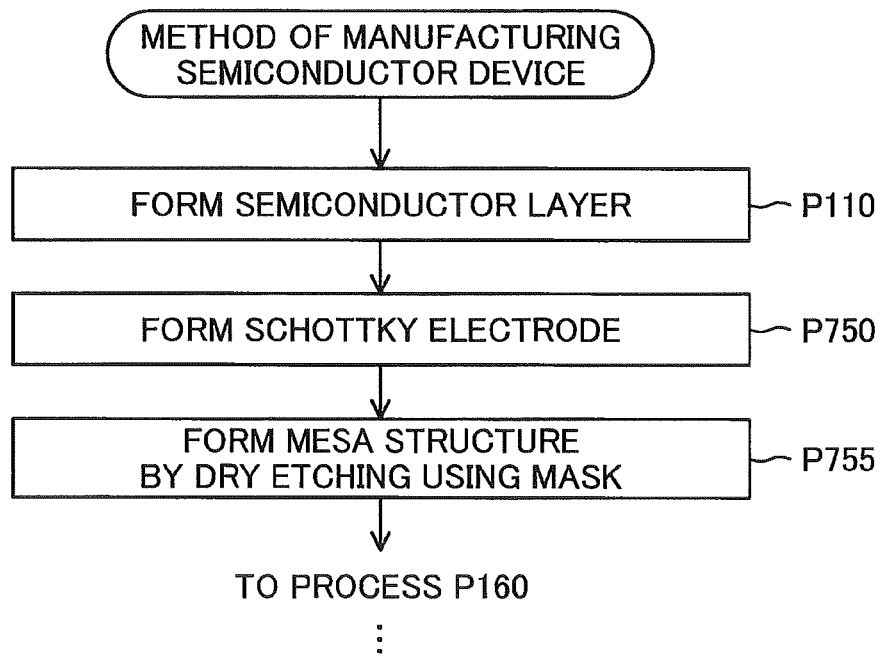
FIG. 6 is a process chart showing a method of manufacturing a semiconductor device according to a second embodiment.

FIG. 6 is a process chart showing a method of manufacturing a semiconductor device 100 according to a second embodiment. The semiconductor device 100 of the second embodiment is the same as that of the first embodiment, except that the semiconductor device 100 of the second embodiment is manufactured by a different method.

After forming the semiconductor layer 112 in the same way as in the first embodiment (process P110), the manufacturer forms the Schottky electrode 150 on the semiconductor layer 112 (process P750). In this embodiment, the manufacturer forms the Schottky electrode 150 by electron beam deposition using a lift-off technique. Electron beam deposition is not the only method of forming the Schottky electrode 150. The Schottky electrode 150 may also be formed by resistance heating deposition or sputtering. In a different embodiment, the manufacturer may form the Schottky electrode 150 by forming an electrode on the entire surface of the semiconductor layer 112 and then removing this electrode partially.

After forming the Schottky electrode 150 (process P750), the manufacturer forms the mesa structure 112*m* in the semiconductor layer 112 by dry etching using a mask (process P755). In this embodiment, the manufacturer forms a mask pattern (photoresist) corresponding to the mesa structure 112*m*. Then, the manufacturer removes the semiconductor layer 112 partially by dry etching using a chlorine (Cl)-based material, thereby forming the mesa structure 112*m* in the semiconductor layer 112. After forming the mesa structure 112*m* (process P755), the manufacturer forms the insulating film 160 (process P160) and performs the subsequent processes in the same way as in the first embodiment.

According to the aforementioned second embodiment, like in the first embodiment, the leakage current at the reverse voltage can be suppressed sufficiently while each of a material of the Schottky electrode 150 and that of the insulating film 160 is allowed to be selected from a wide range of choices. Further, since the Schottky electrode 150 is formed before the mesa structure 112*m* and the peripheral surface 112*p* are formed in the semiconductor layer 112, this can suppress contamination of an interface between the Schottky electrode 150 and the semiconductor layer 112 occurring during processes.

C. Third Embodiment

Figure 7:
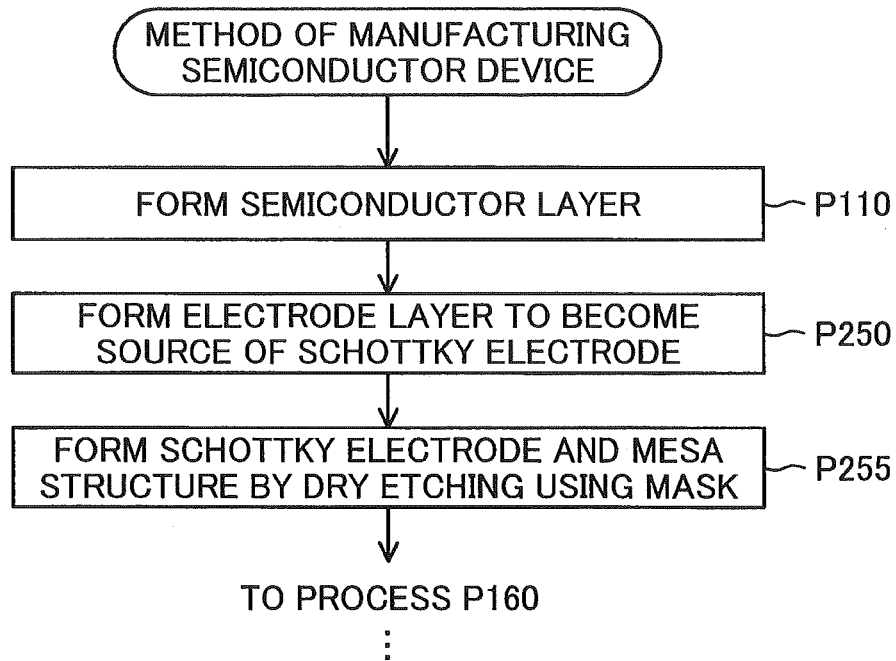
FIG. 7 is a process chart showing a method of manufacturing a semiconductor device according to a third embodiment.

FIG. 7 is a process chart showing a method of manufacturing a semiconductor device 100 according to a third embodiment. The semiconductor device 100 of the third embodiment is the same as that of the first embodiment except that the semiconductor device 100 of the third embodiment is manufactured by a different method.

After forming the semiconductor layer 112 in the same way as in the first embodiment (process P110), the manufacturer forms an electrode layer, which is to be shaped into the Schottky electrode 150, on the entire surface of the semiconductor layer 112 (process P250). In this embodiment, the manufacturer forms the electrode layer by electron beam deposition. Electron beam deposition is not the only method of forming the electrode layer. The electrode layer may also be formed by resistance heating deposition or sputtering.

After forming the electrode layer to be shaped into the Schottky electrode 150 (process P250), the manufacturer forms the mesa structure 112*m* and the Schottky electrode 150 by dry etching using a mask (process P255). In this embodiment, the manufacturer forms a mask pattern (photoresist) corresponding to the mesa structure 112*m*. Then, the manufacturer removes the source electrode layer and the semiconductor layer 112 partially by dry etching using a chlorine (Cl)-based material, thereby forming the Schottky electrode 150 and the mesa structure 112*m*. After forming the Schottky electrode 150 and the mesa structure 112*m* (process P255), the manufacturer forms the insulating film 160 (process P160) and performs the subsequent processes in the same way as in the first embodiment.

According to the aforementioned third embodiment, like in the first embodiment, the leakage current at the reverse voltage can be suppressed sufficiently while each of a material of the Schottky electrode 150 and that of the insulating film 160 is allowed to be selected from a wide range of choices. Further, since the electrode layer to be shaped into the Schottky electrode 150 is formed before the mesa structure 112*m* and the peripheral surface 112*p* are formed in the semiconductor layer 112, this can suppress contamination of the interface between the Schottky electrode 150 and the semiconductor layer 112 occurring during processes. Additionally, the distance Da between the end portion 150*e* of the Schottky electrode 150 and the end portion 112*e* of the upper surface 112*u* can be restricted, so that the electric field crowding at the end portion 150*e* of the Schottky electrode 150 can be reduced effectively.

D. Fourth Embodiment

Figure 8:
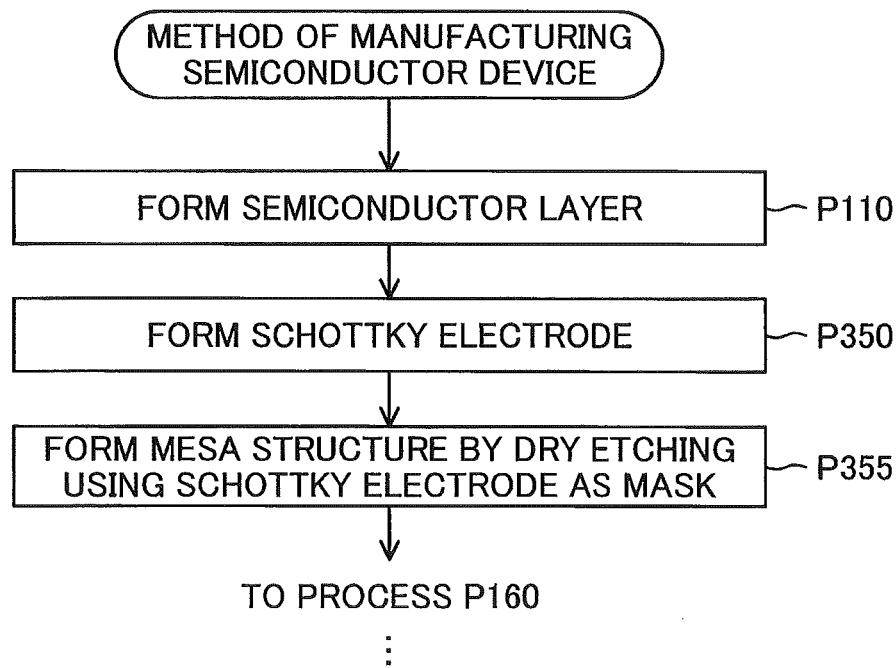
FIG. 8 is a process chart showing a method of manufacturing a semiconductor device according to a fourth embodiment.

FIG. 8 is a process chart showing a method of manufacturing a semiconductor device 100 according to a fourth embodiment. The semiconductor device 100 of the fourth embodiment is the same as that of the first embodiment, except that the semiconductor device 100 of the fourth embodiment is manufactured by a different method.

After forming the semiconductor layer 112 in the same way as in the first embodiment (process P 110), the manufacturer forms the Schottky electrode 150 on the semiconductor layer 112 (process P350). In this embodiment, the manufacturer forms the Schottky electrode 150 by electron beam deposition using a lift-off technique. Electron beam deposition is not the only method of forming the Schottky electrode 150. The Schottky electrode 150 may also be formed by resistance heating deposition or sputtering. In a different embodiment, the manufacturer may form the Schottky electrode 150 by forming an electrode on the entire surface of the semiconductor layer 112 and then removing this electrode partially.

After forming the Schottky electrode 150 (process P350), the manufacturer forms the mesa structure 112*m* in the semiconductor layer 112 by dry etching using the Schottky electrode 150 as a mask (process P355). In this embodiment, the manufacturer removes the semiconductor layer 112 partially by dry etching using a chlorine (Cl)-based material, thereby forming the mesa structure 112*m* in the semiconductor layer 112. After forming the mesa structure 112*m* (process P355), the manufacturer forms the insulating film 160 (process P160) and performs the subsequent processes in the same way as in the first embodiment.

According to the aforementioned fourth embodiment, like in the first embodiment, the leakage current at the reverse voltage can be suppressed sufficiently while each of a material of the Schottky electrode 150 and that of the insulating film 160 is allowed to be selected from a wide range of choices. Further, since the Schottky electrode 150 is formed before the mesa structure 112*m* and the peripheral surface 112*p* are formed in the semiconductor layer 112, this can suppress contamination of the interface between the Schottky electrode 150 and the semiconductor layer 112 occurring during processes. Further, since self-alignment is achieved using the Schottky electrode 150, this eliminates the need to separately prepare a mask for formation of the mesa structure 112*m*, and manufacturing costs can be cut down. Additionally, the distance Da between the end portion 150*e* of the Schottky electrode 150 and the end portion 112*e* of the upper surface 112*u* can be restricted, so that the electric field crowding at the end portion 150*e* of the Schottky electrode 150 can be reduced effectively.

E. Fifth Embodiment

Figure 9:
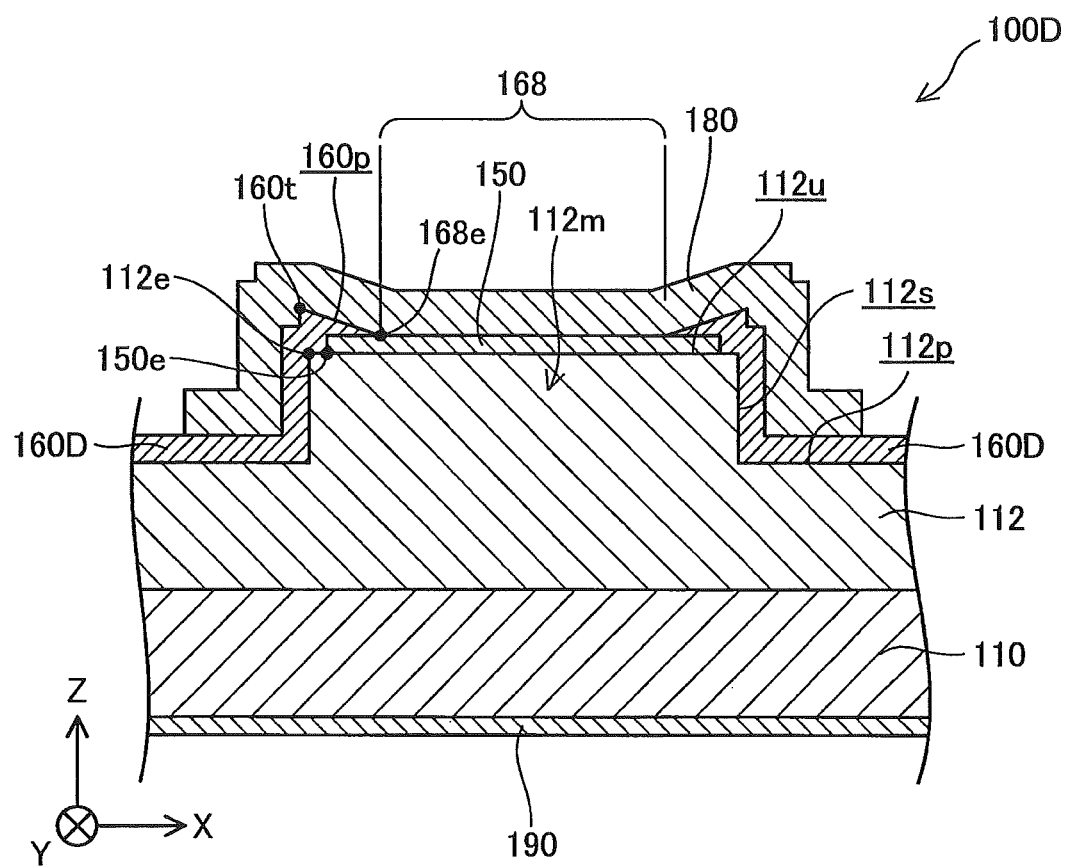
FIG. 9 is a sectional view schematically showing the structure of a semiconductor device according to a fifth embodiment.

FIG. 9 is a sectional view schematically showing the structure of a semiconductor device 100D according to a fifth embodiment. The semiconductor device 100D is the same as the semiconductor device 100 of the first embodiment except that the semiconductor device 100D includes an insulating film 160D instead of the insulating film 160.

The insulating film 160D of the semiconductor device 100D is the same as the insulating film 160 of the first embodiment except that the insulating film 160D has an inclined surface 160*p*. The inclined surface 160*p* of the insulating film 160D is a surface that extends from the end portion 168*e* of the opening 168 to a top 160*t* of the insulating film 160D. The top 160*t* is located outside the end portion 150*e* of the Schottky electrode 150. The inclined surface 160*p* is a surface that extends outward beyond the end portion 150*e* of the Schottky electrode 150. The inclined surface 160*p* faces the inside of the opening 168. In this embodiment, the inclined surface 160*p* is formed by partially removing the insulating film 160D. In this embodiment, the inclined surface 160*p* is formed together with the opening 168 in the process of manufacturing that forms the opening 168. The structure of the inclined surface 160*p* may also be applicable to other embodiments described below.

According to the aforementioned fifth embodiment, like in the first embodiment, the leakage current at the reverse voltage can be suppressed sufficiently while each of a material for the Schottky electrode 150 and that for the insulating film 160D is allowed to be selected from a wide range of choices. Further, since the thickness of the insulating film 160D located on the end portion 150*e* of the Schottky electrode 150 can be restricted, the electric field crowding from above the end portion 150*e* of the Schottky electrode 150 can be reduced effectively at the end portion 150*e* of the Schottky electrode 150.

F. Sixth Embodiment

Figure 10:
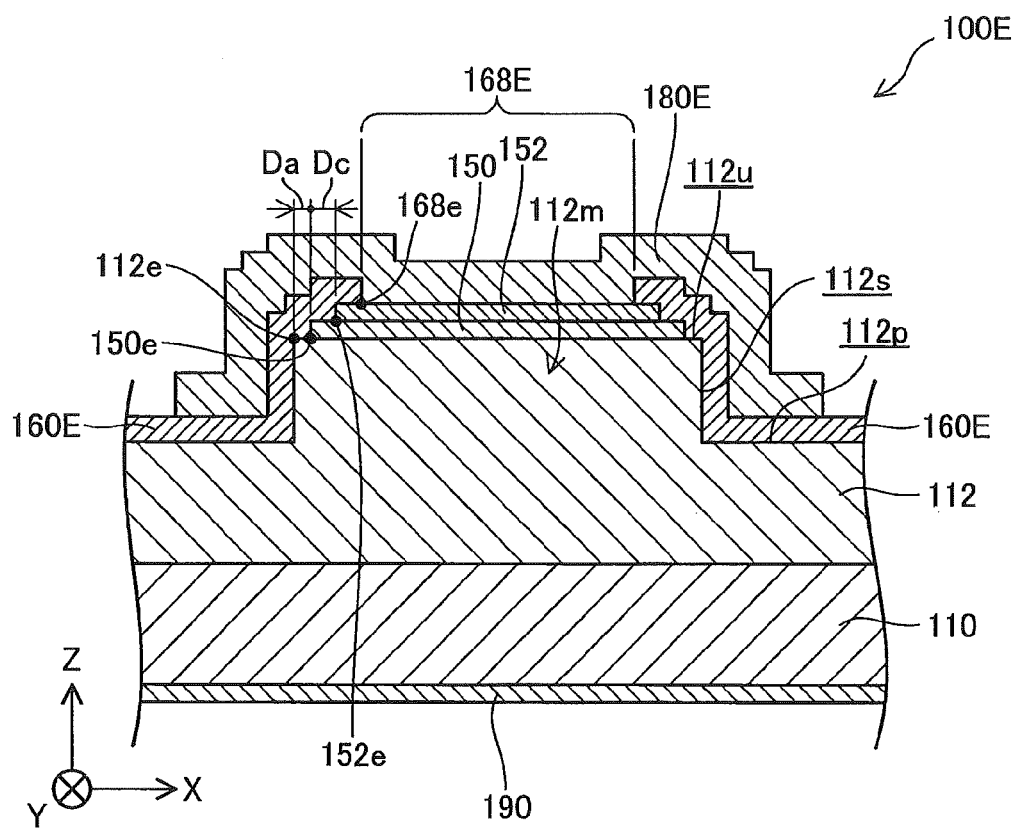
FIG. 10 is a sectional view schematically showing the structure of a semiconductor device according to a sixth embodiment.

FIG. 10 is a sectional view schematically showing the structure of a semiconductor device 100E according to a sixth embodiment. The semiconductor device 100E is the same as the semiconductor device 100 of the first embodiment except that the semiconductor device 100E includes an intermediate electrode 152, an insulating film 160E instead of the insulating film 160, and a wiring electrode 180E instead of the wiring electrode 180.

The intermediate electrode 152 of the semiconductor device 100E is a second electrode layer formed on the Schottky electrode 150, which is a first electrode layer. The intermediate electrode 152 and the Schottky electrode 150 function together as a Schottky electrode.

In the sixth embodiment, unlike in the first embodiment, the Schottky electrode 150 is an electrode layer mainly made of nickel (Ni) having a thickness of about 100 nm. In this embodiment, the intermediate electrode 152 is formed by stacking the following layers in the order as seen from the Schottky electrode 150: a layer mainly made of nickel (Ni) having a thickness of about 100 nm; a layer mainly made of palladium (Pd) having a thickness of about 100 nm; and a layer mainly made of molybdenum (Mo) having a thickness of about 20 nm The thickness of an electrode layer that can be formed once using a lift-off technique is limited. Thus, in this embodiment, after forming the Schottky electrode 150 using the lift-off technique, the manufacturer forms the intermediate electrode 152 using the lift-off technique.

An end portion 152e of the intermediate electrode 152 is located inside the end portion 150e of the Schottky electrode 150. A distance Dc between the end portion 150e of the Schottky electrode 150 and the end portion 152e of the intermediate electrode 152 is equal to or larger than the distance Da between the end portion 150e of the Schottky electrode 150 and the end portion 112e of the upper surface 112u. In terms of preventing diffusion of the materials of the intermediate electrode 152 toward the end portion 150e of the Schottky electrode 150, the distance Dc is preferably equal to or larger than the distance Da, more preferably five times the distance Da or more, still more preferably 10 times the distance Da or more. To suppress increase in ON resistance caused by reduction in contact area between the intermediate electrode 152 and the wiring electrode 180E, it is preferable that the distance Dc be 100 times the distance Da or less.

The insulating film 160E of the semiconductor device 100E extends from the peripheral surface 112p and across the side surface 112s, and reaches onto the intermediate electrode 152. The insulating film 160E is the same as the insulating film 160 of the first embodiment except that the insulating film 160E has an opening 168E formed on the intermediate electrode 152.

The wiring electrode 180E of the semiconductor device 100E is the same as the wiring electrode 180 of the first embodiment except that the wiring electrode 180E is electrically connected through the intermediate electrode 152 to the Schottky electrode 150 inside the opening 168E.

According to the aforementioned sixth embodiment, like in the first embodiment, the leakage current at the reverse voltage can be suppressed sufficiently while each of a material of the Schottky electrode 150 and that of the insulating film 160E is allowed to be selected from a wide range of choices. Further, since a distance between the Schottky contact and the wiring electrode 180E can be ensured using the intermediate electrode 152, this can suppress change in electrical characteristics of the Schottky electrode 150 to be caused by the wiring electrode 180E. Additionally, since the end portion 152e of the intermediate electrode 152 is located inside the end portion 150e of the Schottky electrode 150, this can suppress change in a Schottky barrier height to be caused by diffusion of the materials of the intermediate electrode 152 into the semiconductor layer 112 through the end portion 150e of the Schottky electrode 150.

G. Seventh Embodiment

Figure 11:
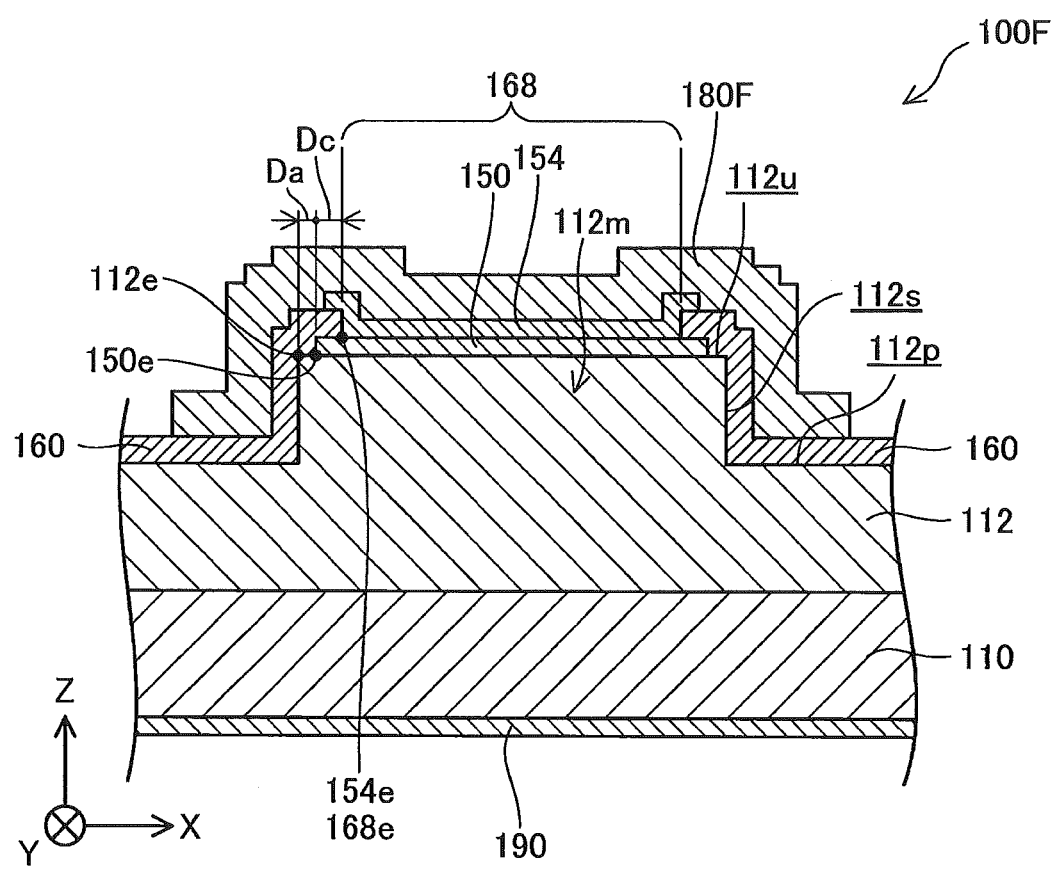
FIG. 11 is a sectional view schematically showing the structure of a semiconductor device according to a seventh embodiment.

FIG. 11 is a sectional view schematically showing the structure of a semiconductor device 100F according to a seventh embodiment. The semiconductor device 100F is the same as the semiconductor device 100 of the first embodiment except that the semiconductor device 100F includes an intermediate electrode 154 and a wiring electrode 180F instead of the wiring electrode 180.

The intermediate electrode 154 of the semiconductor device 100F is another electrode extending from the Schottky electrode 150 inside the opening 168 and reaching onto the insulating film 160. The intermediate electrode 154 electrically connects the Schottky electrode 150 and the wiring electrode 180F. The intermediate electrode 154 and the Schottky electrode 150 function together as a Schottky electrode.

In the seventh embodiment, unlike in the first embodiment, the Schottky electrode 150 is an electrode layer mainly made of nickel (Ni) having a thickness of about 100 nm. In this embodiment, the intermediate electrode 154 is formed by stacking the following layers in the order as seen from the Schottky electrode 150: a layer mainly made of nickel (Ni) having a thickness of about 100 nm; a layer mainly made of palladium (Pd) having a thickness of about 100 nm; and a layer mainly made of molybdenum (Mo) having a thickness of about 20 nm. The thickness of an electrode layer that can be formed once using a lift-off technique is limited. Thus, in this embodiment, after forming the Schottky electrode 150 using the lift-off technique, the manufacturer forms the insulating film 160. Then, the manufacturer forms the intermediate electrode 154 using the lift-off technique.

An end portion 154e of the intermediate electrode 154 is located inside the end portion 150e of the Schottky electrode 150. A distance Dc between the end portion 150e of the Schottky electrode 150 and the end portion 154e of the intermediate electrode 154 is equal to or larger than the distance Da between the end portion 150e of the Schottky electrode 150 and the end portion 112e of the upper surface 112u. In terms of preventing diffusion of the materials of the intermediate electrode 154 toward the end portion 150e of the Schottky electrode 150, the distance Dc is preferably equal to or larger than the distance Da, more preferably five times the distance Da or more, still more preferably 10 times the distance Da or more. To suppress increase in ON resistance caused by reduction in contact area between the intermediate electrode 154 and the wiring electrode 180F, it is preferable that the distance Dc be 100 times the distance Da or less.

The wiring electrode 180F of the semiconductor device 100F is the same as the wiring electrode 180 of the first embodiment except that the wiring electrode 180F is electrically connected through the intermediate electrode 154 to the Schottky electrode 150 inside the opening 168.

According to the aforementioned seventh embodiment, like in the first embodiment, the leakage current at the reverse voltage can be suppressed sufficiently while each of a material of the Schottky electrode 150 and that of the insulating film 160 is allowed to be selected from a wide range of choices. Further, since a distance between the Schottky contact and the wiring electrode 180F can be ensured using the intermediate electrode 154, this can suppress change in electrical characteristics of the Schottky electrode 150 to be caused by the wiring electrode 180F. Additionally, since the end portion 154e of the intermediate electrode 154 is located inside the end portion 150e of the Schottky electrode 150, this can suppress change in a Schottky barrier height to be caused by diffusion of the materials of the intermediate electrode 154 into the end portion 150e of the Schottky electrode 150.

H. Other Embodiments

This invention is not limited to the aforementioned embodiments, examples, or modifications and can be implemented in various structures within a range that does not deviate from the substance of this invention. As an example, technical features in the embodiments, those in the examples, or those in the modifications corresponding to those in each of the aspects described in Summary of Invention can be replaced or combined, where appropriate, with the intention of solving some or all of the aforementioned problems or achieving some or all of the aforementioned effects. Unless being described as absolute necessities in this specification, these technical features may be deleted where appropriate.

A semiconductor device to which this invention is applied is not limited to the semiconductor devices of the aforementioned embodiments and may be any semiconductor device including a Schottky electrode. In the aforementioned embodiments, a donor element in the n-type semiconductor layer is not limited to silicon (Si) and may also be germanium (Ge) or oxygen (O), for example.

What is claimed is:

1. A semiconductor device comprising:
    a semiconductor layer including a mesa structure and a peripheral surface extending around the mesa structure, the mesa structure having a plateau shape with an upper surface and a side surface;
    a Schottky electrode forming a Schottky junction with the upper surface;
    an insulating film extending from the peripheral surface, across the side surface, and onto the Schottky electrode, the insulating film having an opening formed on the Schottky electrode; and
    a wiring electrode electrically connected to the Schottky electrode inside the opening, the wiring electrode extending from inside of the opening, across a portion of the insulating film formed on the side surface, and onto another portion of the insulating film formed on the peripheral surface.

2. The semiconductor device in accordance with claim 1, wherein a distance between an end portion of the Schottky electrode and an end portion of the opening is equal to or larger than a distance between the end portion of the Schottky electrode and an end portion of the upper surface.

3. The semiconductor device in accordance with claim 1, wherein the insulating film has an inclined surface extending from an end portion of the opening and outward beyond an end portion of the Schottky electrode while facing the inside of the opening.

4. The semiconductor device in accordance with claim 1, wherein the Schottky electrode includes:
    a first electrode layer formed on the upper surface; and
    a second electrode layer formed on the first electrode layer,
    wherein an end portion of the second electrode layer is located inside an end portion of the first electrode layer, and
    a distance between the end portion of the first electrode layer and the end portion of the second electrode layer is equal to or larger than a distance between the end portion of the first electrode layer and an end portion of the upper surface.

5. The semiconductor device in accordance with claim 1, further comprising:
    another electrode extending from the Schottky electrode inside the opening and onto the insulating film, the another electrode electrically connecting the Schottky electrode and the wiring electrode.

6. The semiconductor device in accordance with claim 1, wherein a distance between an end portion of the Schottky electrode and an end portion of the upper surface is 2 µm or less.

7. The semiconductor device in accordance with claim 1, wherein the semiconductor layer is an n-type semiconductor layer.

8. The semiconductor device in accordance with claim 1, wherein the semiconductor layer is mainly made of at least one of gallium nitride (GaN), silicon carbide (SiC), silicon (Si), and gallium arsenide (GaAs).

9. The semiconductor device in accordance with claim 1, wherein the Schottky electrode is mainly made of at least one of nickel (Ni), palladium (Pd), platinum (Pt), and iridium (Ir).

10. The semiconductor device in accordance with claim 1, wherein the wiring electrode is mainly made of at least one of aluminum (Al), titanium (Ti), molybdenum (Mo), vanadium (V), tantalum (Ta), gold (Au), and copper (Cu).

11. The semiconductor device in accordance with claim 1, wherein the insulating film is mainly made of at least one of silicon dioxide ($SiO_2$), aluminum oxide ($Al_2O_3$), silicon nitride (SiNx), silicon oxynitride (SiON), zirconium oxynitride (ZrON), aluminum oxynitride (AlON), zirconium oxide ($ZrO_2$), and hafnium oxide (HfO).

12. The semiconductor device in accordance with claim 1, wherein an angle of the side surface relative to the peripheral surface is from 10 to 90 degrees.

13. The semiconductor device in accordance with claim 1, wherein the mesa structure has a height of 0.1 µm or more.

14. A method of manufacturing a semiconductor device, comprising:
    forming a mesa structure and a peripheral surface extending around the mesa structure in a semiconductor layer, the mesa structure having a plateau shape with an upper surface and a side surface, while forming a Schottky electrode forming a Schottky junction with the upper surface;
    forming an insulating film extending from the peripheral surface, across the side surface, and onto the Schottky electrode;
    forming an opening in the insulating film through which the Schottky electrode is exposed; and
    forming a wiring electrode electrically connected to the Schottky electrode inside the opening, the wiring electrode extending from inside of the opening, across a portion of the insulating film formed on the side surface, and onto another portion of the insulating film formed on the peripheral surface.

15. The method of manufacturing the semiconductor device in accordance with claim 14, wherein the Schottky electrode is formed after the mesa structure and the peripheral surface are formed in the semiconductor layer.

16. The method of manufacturing the semiconductor device in accordance with claim 14, wherein the mesa structure and the peripheral surface are formed by dry etching using a mask after the Schottky electrode is formed on the semiconductor layer.

17. The method of manufacturing the semiconductor device in accordance with claim 14, wherein the Schottky electrode, the mesa structure, and the peripheral surface are formed by:
    forming an electrode layer, which is to be shaped into the Schottky electrode, on a surface of the semiconductor layer before the mesa structure and the peripheral surface are formed; and then
    processing the electrode layer and the semiconductor layer together by dry etching using a mask, thereby forming the Schottky electrode together with the mesa structure and the peripheral surface.

18. The method of manufacturing the semiconductor device in accordance with claim 14, wherein the Schottky electrode, the mesa structure, and the peripheral surface are formed by:

forming the Schottky electrode on a surface of the semiconductor layer before the mesa structure and the peripheral surface are formed; and then
processing the semiconductor layer by dry etching using the Schottky electrode as a mask, thereby forming the mesa structure and the peripheral surface.

\* \* \* \* \*